United States Patent [19]

Watanabe et al.

[11] Patent Number: 4,476,502
[45] Date of Patent: Oct. 9, 1984

[54] NOISE REDUCTION SYSTEM

[75] Inventors: Kazuo Watanabe; Yasuo Kominami, both of Takasaki; Yoshiyuki Takizawa, Tokorozawa; Akira Haeno, Iruma, all of Japan

[73] Assignees: Hitachi, Ltd.; Pioneer Electronic Corporation, both of Tokyo, Japan

[21] Appl. No.: 411,996

[22] Filed: Aug. 27, 1982

[30] Foreign Application Priority Data

Aug. 28, 1981 [JP] Japan .................................. 56-134008

[51] Int. Cl.$^3$ .......................... G11B 5/45; G11B 5/02
[52] U.S. Cl. ....................................... 360/65; 330/295
[58] Field of Search ............................ 360/65, 68, 25; 307/264; 330/278, 295, 311

[56] References Cited

U.S. PATENT DOCUMENTS 4,263,624  4/1981  Gundry .................................. 360/65

Primary Examiner—Vincent P. Canney
Attorney, Agent, or Firm—Antonelli, Terry & Wands

[57] ABSTRACT

A noise reduction system is provided which can operate as either a Dolby B-type or C-type system. In either case, an input signal is applied to the variable impedance of a high-level side chain through an identical shared filter circuit network. The high-level side chain has two voltage-current converters for controlling the variable impedance. By substantially inhibiting the operation of one of the two converters, the system operates as a C-type Dolby system. On the other hand, when the system operates as a B-type Dolby system, a bias current is applied to each of the two converters during periods of no input signal. This bias current is about half of a minute bias control current which is applied during no signal periods to the single converter used when the system operates as the C-type Dolby system.

10 Claims, 14 Drawing Figures

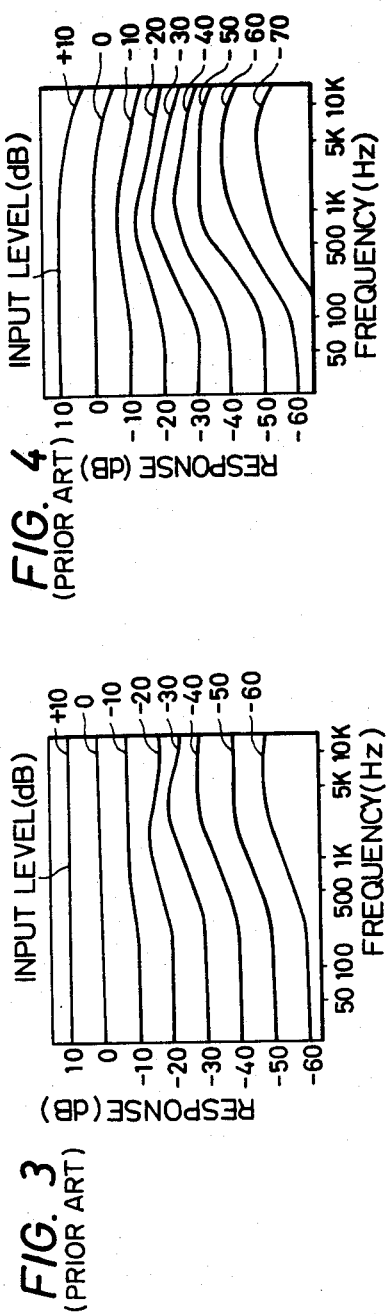
FIG. 3 (PRIOR ART)
FIG. 4 (PRIOR ART)
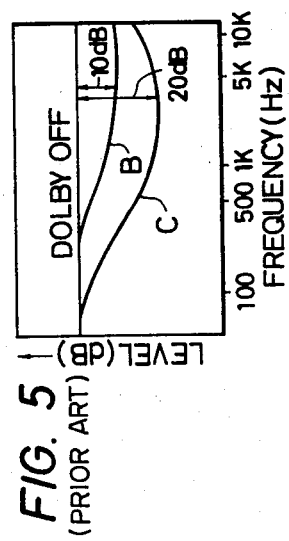
FIG. 5 (PRIOR ART)

FIG. 7 B-TYPE ENCODER

NOISE REDUCTION SYSTEM

BACKGROUND OF THE INVENTION

The present invention relates to a noise reduction system.

It has heretofore been known that, in order to improve the S/N (signal-to-noise) ratio of certain specified transmission systems or specified recording/playback systems, a noise reduction system including a signal compressor and a signal expander is used for the system.

In particular, a noise reduction system wherein the circuit constituent parts of a signal compressor and those of a signal expander are shared and wherein the function of the signal compressor and that of the signal expander can be changed-over by transferring a mode switch has been proposed in the "Journal of the Society of Electronic and Radio Technicians", Vol. 8, May/-June 1974. The switchable signal compressor/signal expander of this type is well known to those in the art as the "Dolby B-type Noise Reduction System" (the word "Dolby" is registered trademark of Dolby Laboratories).

By changing-over the Dolby B-type noise reduction system to the signal compressor, this system becomes an encoder. The signal compressor (encoder) compresses the dynamic range of an input signal before this input signal is recorded on a recording tape. By changing-over the system to the signal expander, this system becomes a decoder. The signal expander (decoder) restores the linearity of the dynamic range for the input signal. The amount of noise which is introduced in a recording/playback process is considerably reduced by this arrangement. Accordingly, the signal compressor/-signal expander combination operates as a noise reduction system.

In the Dolby B-type noise reduction system, the operation of signal compression/signal expansion is usually performed for signal components whose frequencies are higher than the frequency value of 200 Hz.

The Dolby C-type noise reduction system has recently been developed on the basis of the Dolby B-type noise reduction system. Although the Dolby C-type system has a similar circuit arrangement to the B-type system, it differs greatly in its noise reduction effect. In particular, whereas the B-type exhibits a noise reduction level of approximately 10 dB at a frequency of 5 kHz, the C-type is improved to a noise reduction level of approximately 20 dB at the frequency of 5 kHz.

FIG. 1 shows circuit blocks for the well-known Dolby C-type noise reduction system when connected to operate as an encoder.

A recording input signal at an input terminal $T_1$ is applied to the input terminal of a spectral skewing network 11. In order to prevent a high-frequency gain from decreasing during a large-amplitude recording operation due to the characteristic of a tape, signal levels at frequencies of 10 kHz–20 kHz are reduced by the spectral skewing network 11. Thus, encode and decode errors at the specified frequencies of 10 kHz–20 kHz are remarkably reduced An output signal from the spectral skewing network 11 is applied to one input terminal of a combining network 12 and is also applied to the other input terminal of the combining network 12 through a high-level side chain 13, whereby an output signal from the combining circuit 12 is provided from a terminal $T_2$.

Thus, the signal path between the terminals $T_1$ and $T_2$ constructs the first level processing circuit of the Dolby C-type encoder. Further, a signal path extending between terminals $T_3$ and $T_4$ constructs the second level processing circuit of the Dolby C-type encoder.

When the terminals $T_2$ and $T_3$ are connected, the output signal of the combining circuit 12 is applied to an anti-saturation network 14 and a low-level side chain 15. The anti-saturation network 14 operates at a high signal level, thereby to prevent the saturation of the tape, high-frequency signal loss and an increase of the distortion factor.

Since an output signal from the anti-saturation network 14 and an output signal from the low-level side chain 15 are respectively applied to one input terminal and the other input terminal of a combining network 16, the encoded output signal of the Dolby C-type encoder can be derived from the output terminal $T_4$ of the combining network 16.

The encoded output signal of the Dolby B-type encoder typically has amplitude-frequency characteristics such as those shown in FIG. 3. On the other hand, the encoded output signal of the Dolby C-type encoder typically has amplitude-frequency characteristics such as those shown in FIG. 4. In comparing these two figures, it can be seen that as the signal amplitude level lowers, the amplitude value of the frequency component higher than 200 Hz contained in the encoded output signal of the Dolby C-type encoder becomes equal to about double that of the same frequency component contained in the encoded output signal of the Dolby B-type encoder.

FIG. 2 shows circuit blocks for the well-known Dolby C-type noise reduction system connected to operate as a decoder.

An input terminal $T_5$ has a playback input signal from a playback pre-amplifier applied thereto, and is connected to one input terminal of the combining network 16. An output signal from the combining network 16 is applied to the anti-saturation network 14 through a signal inverter 17. An output signal from the anti-saturation network 14 is supplied to a terminal $T_6$, and is also supplied to the other input terminal of the combining network 16 through the low-level side chain 15.

Thus, the signal path between the terminals $T_5$ and $T_6$ constructs the first level processing circuit of the Dolby C-type decoder. Since the combination of the signal inverter 17 and the combining network 16 executes the subtraction of the signals, signal components higher than 200 Hz in the amplitude-frequency characteristics of the output signal of the first level processing circuit come to have a smaller amplitude value gradually with the lowering of the signal level.

Further, a signal path extending between terminals $T_7$ and $T_8$ constructs the second level processing circuit of the Dolby C-type decoder. More specifically, when the terminals $T_6$ and $T_7$ are connected, the output signal of the anti-saturation network 14 is supplied to one input terminal of the combining network 12. An output signal from the combining network 12 is supplied to the input terminal of the spectral skewing network 11 through a signal inverter 18, and is further supplied to the other input terminal of the combining network 12 through the high-level side chain 13. Since the combination of the signal inverter 18 and the combining network 12 similarly executes the subtraction of the signals, signal components higher than 200 Hz in the amplitude-frequency characteristics of the output signal of the spectral skewing network 11 to be derived from the terminal $T_8$ come to have a smaller amplitude value gradually with the lowering of the signal level.

Thus, the overall characteristics of the signal path from the terminal $T_5$ to the terminal $T_8$ become inverse to the amplitude-frequency characteristics of FIG. 4.

FIG. 5 illustrates the noise reduction level owing to the noise reduction system based on the combination of the foregoing Dolby C-type encoder and Dolby C-type decoder, and the noise reduction level owing to the Dolby B-type noise reduction system.

In the side chain of the known Dolby B-type noise reduction system, the input signal of the side chain is supplied to a variable impedance through a filter circuit network which typically includes a parallel connection consisting of a capacitor of 4700 pF and a resistor of 47 kΩ. Accordingly, the low-frequency gain of the side chain of the known B-type system is determined by the resistor of 47 kΩ and the impedance of the variable impedance, while the high-frequency gain of the side chain is determined by an impedance based on the capacitor of 4700 pF and the impedance of the variable impedance.

On the other hand, in the side chain of the known Dolby C-type noise reduction system, the input signal of the side chain is supplied to a variable impedance through a filter circuit network which typically includes a parallel connection consisting of a capacitor of 10,000 pF and a resistor of 47 kΩ. Accordingly, the low-frequency gain of the side chain of the known C-type system is determined by the resistor of 47 kΩ and the impedance of the variable impedance, while the high-frequency gain of the side chain is determined by an impedance based on the capacitor of 10,000 pF and the impedance of the variable impedance.

In developing a noise reduction system operable as the Dolby B-type system or the Dolby C-type system, the inventors studied, prior to the present invention, a system wherein one of two resistors connected in series and each having a resistance of 24 kΩ is controlled to be short-circuited or opened thereacross by a first mechanical switch, and two capacitors each having a capacitance of 4700 pF are controlled to become parallel or unparallel by a second mechanical switch, thereby to construct a filter circuit network which could be used either for the C-type or the B-type system. The inventors also studied another system wherein a parallel connection consisting of a resistor of 47 kΩ and a capacitor of 4700 pF has another capacitor of 4700 pF connected to be unparallel or parallel thereto by the "off" or "on" operation of a mechanical switch. This could also serve as a filter circuit network for either the B-type or the C-type systems. However, although these arrangements could serve as suitable filters for both types of systems, the inventors' study has revealed that the mechanical switch or switches required in either of the above systems considerably increase the product price of the noise reduction system. In addition, it also lowers the operating reliability of the system.

SUMMARY OF THE INVENTION

Accordingly, it is an object of the present invention to provide a noise reduction system which is operable as either a Dolby B-type system or C-type system, and which provides a straightforward filter circuit network for the side chain which is suitable for either type of system.

It is a further object of the present invention to provide a noise reduction system in which the encode errors and decode errors of the B-type system or C-type system are reduced.

To achieve these and other objects, the present invention provides a noise reduction system which operates as either a B-type or C-type system, wherein the input signal of a side chain is supplied to a variable impedance through a shared filter circuit network. In addition, the system includes an arrangement which permits different control of the variable impedance of a high-level side chain in accordance with whether the system is operated as a B-type or C-type system.

BRIEF DESCRIPTION OF THE DRAWINGS

FIG. 3 shows the amplitude-frequency characteristics of the encoded output signal of a well-known Dolby B-type encoder;

FIG. 4 shows the amplitude-frequency characteristics of the encoded output signal of the well-known Dolby C-type encoder;

FIG. 5 shows the level of noise reduction by the noise reduction system based on the combination of the Dolby C-type encoder and the Dolby C-type decoder, and the level of noise reduction by a Dolby B-type noise reduction system;

DESCRIPTION OF THE PREFERRED EMBODIMENTS

Hereunder, embodiments of the present invention will be described with reference to the drawings.

Figure 6:
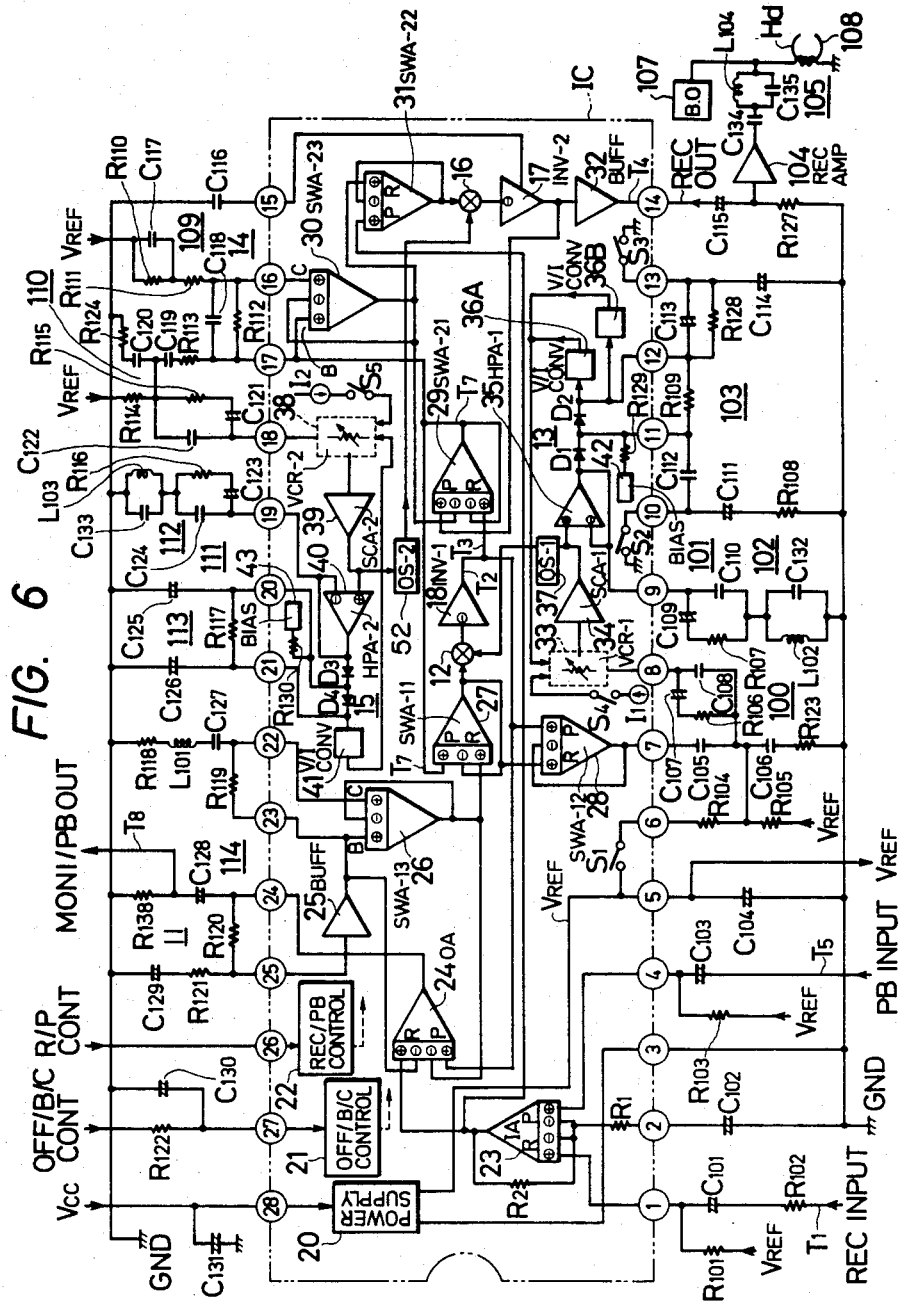
FIG. 6 shows a block diagram of a noise reduction system according to an embodiment of the present invention.

FIG. 6 shows a block diagram of a Dolby noise reduction system according to an embodiment of the present invention which can operate as either a B-type or a C-type system. Circuit elements inside a broken line IC are formed within a monolithic semiconductor integrated circuit (hereinbelow, termed "IC"), and numerals enclosed with circles indicate the external connecting terminals of the IC.

Terminal No. 1 of the IC is supplied with a bias voltage $V_{REF}$ through a resistor $R_{101}$, and is also supplied with an audio recording signal REC INPUT through a resistor $R_{102}$ as well as a capacitor $C_{101}$.

Terminal No. 2 of the IC is grounded through a capacitor $C_{102}$, and Terminal No. 3 thereof is connected to the ground potential GND as a ground terminal.

Terminal No. 4 of the IC is supplied with the bias voltage $V_{REF}$ through a resistor $R_{103}$, and is also supplied with an audio playback signal PB INPUT through a capacitor $C_{103}$.

Terminal No. 5 of the IC is grounded through a capacitor $C_{104}$ for removing A.C. ripples, and the bias voltage $V_{REF}$ which is supplied to various circuit parts is generated from Terminal No. 5.

Terminal No. 6 of the IC is supplied with the bias voltage $V_{REF}$ through resistors $R_{104}$ and $R_{105}$. The resistor $R_{104}$ is set at a resistance of 5.1 k$\Omega$, and the resistor $R_{105}$ at a resistance of 15 k$\Omega$.

Connected between Terminals No. 7 and No. 8 of the IC is a filter circuit network 100 which is constructed of capacitors $C_{105}$, $C_{106}$, $C_{107}$ and $C_{108}$ and resistors $R_{106}$ and $R_{123}$.

In an example according to the present invention, the capacitor $C_{108}$ is set at a capacitance of 10,000 pF, and the resistor $R_{106}$ at a resistance of 47 k$\Omega$. The capacitor $C_{105}$ is set at a capacitance of 0.015 $\mu$F, the capacitor $C_{106}$ at 0.015 $\mu$F, the capacitor $C_{107}$ at 10 $\mu$F, and the resistor $R_{123}$ is set at a resistance of 100$\Omega$.

Terminal No. 9 of the IC is connected to a frequency characteristic determining circuit 101 which is constructed of capacitors $C_{109}$ and $C_{110}$ and a resistor $R_{107}$, and it is also connected to a bias trap circuit 102 which is constructed of an inductor $L_{102}$ and a capacitor $C_{132}$. The parallel resonance frequency of this bias trap circuit 102 is set to be substantially equal to the frequency of an A.C. bias signal which is generated by a bias oscillator 107 to be described later.

Terminals No. 10, No. 11, No. 12 and No. 13 of the IC are connected to a time constant circuit 103 which determines the rectifying characteristics of rectifying diodes $D_1$ and $D_2$ in the side chain of the noise reduction system. The time constant circuit 103 is constructed of capacitors $C_{111}$, $C_{112}$, $C_{113}$ and $C_{114}$ and resistors $R_{108}$, $R_{109}$ and $R_{128}$.

In an example according to the present invention, the resistor $R_{128}$ is set at a resistance of 1 M$\Omega$. The capacitor $C_{111}$ and $C_{112}$ are set at a capacitance of 0.33 $\mu$F and those $C_{113}$ and $C_{114}$ at 1 $\mu$F. The resistor $R_{108}$ is set at a resistance of 4.7 k$\Omega$ and that $R_{109}$ at 82 k$\Omega$.

Terminal No. 14 of the IC is grounded through a capacitor $C_{115}$ as well as a resistor $R_{127}$, and the common node of the capacitor $C_{115}$ and the resistor $R_{127}$ is connected to the input terminal of a recording amplifier 104. The output terminal of the recording amplifier 104 is connected to a recording magnetic head 108 through an output coupling capacitor $C_{134}$ as well as a bias trap circuit 105. On the other hand, the A.C. bias signal generated from the bias oscillator 107 is supplied to the recording magnetic head 108. The bias trap circuit 105 is constructed of an inductor $L_{104}$ and a capacitor $C_{135}$, and the parallel resonance frequency thereof is determined to be substantially equal to the frequency of the A.C. bias signal which is generated by the bias oscillator 107.

Terminal No. 15 of the IC is grounded through a phase compensation capacitor $C_{116}$, whereby the A.C. operation of a signal inverter 17 in the IC is stabilized.

Terminals No. 16 and No. 17 of the IC are connected to a filter circuit 109 which is constructed of capacitors $C_{117}$ and $C_{118}$ and resistors $R_{110}$, $R_{111}$ and $R_{112}$, and which forms a part of an anti-saturation circuit 14.

Terminals No. 17 and No. 18 of the IC are connected to a filter circuit network 110 which is constructed of capacitors $C_{119}$, $C_{120}$, $C_{121}$ and $C_{122}$ and resistors $R_{114}$, $R_{115}$ and $R_{124}$.

In an example according to the present invention, the capacitor $C_{122}$ is set at a capacitance of 10,000 pF, and the resistor $R_{115}$ at a resistance of 47 k$\Omega$. The capacitor $C_{119}$ is set at a capacitance of 0.012 $\mu$F, the capacitor $C_{120}$ at 0.01 $\mu$F and the capacitor $C_{121}$ at 10 $\mu$F. The resistor $R_{114}$ is set at a resistance of 16 k$\Omega$ and the resistor $R_{124}$ at 220$\Omega$.

Terminal No. 19 of the IC is connected to a frequency characteristic determining circuit 111 which is constructed of capacitors $C_{123}$ and $C_{124}$ and a resistor $R_{116}$, and it is then connected to a bias trap circuit 112 which is especially constructed of an inductor $L_{103}$ and a capacitor $C_{133}$ in accordance with the present invention. The parallel resonance frequency of this bias trap circuit 112 is determined to be subtantially equal to the frequency of the A.C. bias signal which is generated by the bias oscillator 107.

Terminals No. 20 and No. 21 of the IC are connected to a time constant circuit 113 which determines the rectifying characteristics of rectifying diodes $D_3$ and $D_4$ in the side chain of the noise reduction system. The time constant circuit 113 is constructed of capacitors $C_{125}$ and $C_{126}$ and a resistor $R_{117}$. The capacitor $C_{125}$ is set at a capacitance of 0.15 $\mu$F and the capacitor $C_{126}$ at 0.47 $\mu$F. The resistor $R_{117}$ is set at a resistance of 82 k$\Omega$.

Terminals No. 22, No. 23, No. 24 and No. 25 of the IC are connected to a filter circuit 114 which is constructed of capacitors $C_{127}$, $C_{128}$ and $C_{129}$, an inductor $L_{101}$, and resistors $R_{118}$, $R_{119}$, $R_{120}$, $R_{121}$ and $R_{138}$, and which forms a part of a spectral skewing network 11.

Terminal No. 26 of the IC has a recording/playback change-over control signal R/P CONT applied thereto.

Terminal No. 27 of the IC is connected to the ground potential through a capacitor $C_{130}$, and has a Dolby OFF/B/C change-over control signal OFF/B/C CONT applied thereto through a resistor $R_{122}$.

Terminal No. 28 of the IC is connected to the ground potential through a capacitor $C_{131}$, and is supplied with a power source voltage $V_{CC}$.

A power supplying circuit 20 is fed with the power source voltage $V_{CC}$ from Terminal No. 28, so that the bias voltage $V_{REF}$ (at a level of about $V_{CC}/2$) is generated at Terminal No. 5.

A Dolby OFF/B/C change-over control circuit 21 has the control signal OFF/B/C applied thereto from Terminal No. 27. Although specific connections are not shown for purposes of drawing simplification, this change-over control circuit 21 is coupled to the switches $S_1$, $S_2$, $S_3$, $S_4$ and $S_5$ to control their "on" and "off" states. This control connection is done in accordance with well-known switching principles, and the switches $S_1$ to $S_5$ themselves can be constructed of any conventional switch device suitable for implementation in or with an IC.

The OFF/B/C change-over control circuit 21 includes a tri-state discriminator circuit (not shown in the drawings) for discriminating three voltage levels which are selectively supplied to the Terminal No. 27. The control signal OFF/B/C has three voltage levels. The first level represents selection of the "noise reduction OFF", the second level represents selection of the B-type noise reduction, and the third level represents selection of the C-type noise reduction. For example, the first level can be provided with a ground voltage or a low voltage near ground, the third level can be provided with a high voltage near the power source voltage, and the second level can be provided with a middle voltage between the voltages of the first and third levels.

When the control signal OFF/B/C becomes a first level, an output from the change-over control circuit 21 controls switches $S_4$ and $S_5$ into their "on" states so that the high-level side chain 13 and low-level side chain 15 of the noise reduction system will stop their amplitude-frequency characteristic control operations. Simultaneously therewith, the output of the change-over control circuit 21 controls switches $S_1$, $S_2$ and $S_3$ into their "on" states.

When the control signal OFF/B/C becomes a second level, the output of the change-over control circuit 21 controls the switch $S_5$ into the "on" state so that the low-level side chain 15 of the noise reduction system will stop its amplitude-frequency characteristic control operation so as to cause the noise reduction system of FIG. 6 to operate as a Dolby B-type system. Simultaneously therewith, the output of the change-over control circuit 21 controls the switches $S_1$, $S_2$ and $S_3$ into the "on" states and the switch $S_4$ into the "off" state. Thus, since the switch $S_4$ is in the "off" state, the high-level side chain 13 executes the amplitude-frequency characteristic control operation.

In addition to being coupled to switches $S_1$ to $S_5$, the control circuit 21 is also coupled to the switching amplifiers 26 and 30 to determine, in a known manner, which of their input terminals the amplifiers 26 and 30 will be responsive to (these connections are also not shown for drawing simplification). Accordingly, when the control signal OFF/B/C becomes the second level, the output of the change-over control circuit 21 controls switching amplifiers 26 and 30. As a result, the switching amplifiers 26 and 30 become responsive to input signals applied to the non-inverting input terminals ($\oplus$) of their B sides, and unresponsive to input signals applied to the non-inverting input terminals ($\oplus$) of their C sides.

When the control signal OFF/B/C becomes a third level, the output of the change-over control circuit 21 controls the switches $S_4$ and $S_5$ into the "off" states so that the high-level side chain 13 and low-level side chain 15 of the noise reduction system will execute their amplitude-frequency characteristic control operations to cause the FIG. 6 noise reduction system to operate as a Dolby C-type system. Simultaneously therewith, the output of the change-over control circuit 21 controls the switches $S_1$, $S_2$ and $S_3$ into the "off" states. Further, when the control signal OFF/B/C becomes the third level, the output of the change-over control circuit 21 controls the switching amplifiers 26 and 30, with the result that the switching amplifiers 26 and 30 become responsive to input signals applied to the non-inverting input terminals ($\oplus$) of their C sides and unresponsive to input signals applied to the non-inverting input terminals ($\oplus$) of their B sides.

A recording/playback change-over control circuit 22 has the control signal R/P applied thereto from Terminal No. 26. This control circuit 22 is coupled to the switching amplifiers 23, 24 and 26 to 31 to determine, in a known manner, which of their input terminals these amplifiers will be responsive to (these connections are also not shown for drawing simplification).

The recording/playback change-over control circuit 22 includes a bi-state discriminator circuit (not shown in the drawings) for discriminating two voltage levels which are selectively supplied to the Terminal No. 26.

The control signal R/P has two voltage levels. The first level is provided to select an encoder operation and the second level is provided to select a decoder operation. For example, the first level can be provided with a high voltage near the power source voltage while the second level is provided with the ground or a low voltage near the ground voltage.

When the control signal R/P becomes a first level, a control signal is provided from the change-over control circuit 22 so that the noise reduction system may operate as an encoder. In this case, respective switching amplifiers operate as follows:

(1) Switching amplifiers 23, 24 and 29 become responsive to input signals respectively applied to the non-inverting input terminals ($\oplus$) and inverting input terminals ($\ominus$) of their R sides, and unresponsive to input signals respectively applied to the non-inverting input terminals ($\oplus$) and inverting input terminals ($\ominus$) of their P sides.

(2) Switching amplifiers 26, 27, 28 30 and 31 become responsive to input signals applied to the non-inverting input terminals ($\oplus$) of their R sides, and unresponsive to input signals applied to the non-inverting input terminals ($\oplus$) of their P sides.

When the control signal R/P becomes a second level, a control signal is provided from the change-over control circuit 22 so that the noise reduction system may operate as a decoder. In this case, the respective switching amplifiers operate as follows:

(3) The switching amplifiers 23, 24 and 29 become responsive to input signals respectively applied to the non-inverting input terminals ($\oplus$) and the inverting input terminals ($\ominus$) of their P sides, and unresponsive to input signals respectively applied to the non-inverting input terminals ($\oplus$) and inverting input terminals ($\ominus$) of their R sides.

(4) The switching amplifiers 26, 27, 28, 30 and 31 become responsive to input signals applied to the non-inverting input terminals ($\oplus$) of their P sides, and unresponsive to input signals applied to the non-inverting input terminals of their R sides.

A variable impedance 33, a signal amplifier 34, a gain control amplifier 35, the rectifying diodes $D_1$ and $D_2$, voltage current converters 36A and 36B, an overshoot suppressor 37 and a bias circuit 41 constitute parts of the high-level side chain 13.

When a signal level which is transmitted to the variable impedance 33 through the filter circuit network 100 lowers, the signal amplifier 34, gain control amplifier 35, rectifying diodes $D_1$ and $D_2$ and voltage-current converters 36A and 36B (particularly, output signals from the voltage-current converters 36A and 36B) raise the impedance of the variable impedance 33 and increase the output signal of the signal amplifier 34 (the output signal of the high-level side chain 13) which is supplied to a combining network 12 through the overshoot suppressor 37.

When the switch S₄ falls into the "on" state, a predetermined control current flows from a constant current source $I_1$ into the variable impedance 33, with the result that the impedance of the variable impedance 33 lowers conspicuously. Then, the output signal of the signal amplifier 34 is no longer supplied to the combining network 12 through the overshoot suppressor 37, and the high-level side chain 13 stops its amplitude-frequency characteristic control operation.

A variable impedance 38, a signal amplifier 39, a gain control amplifier 40, the rectifying diodes D₃ and D₄, a voltage-current converter 41 and an overshoot suppressor 52 constitute parts of the low-level side chain 15.

When a signal level which is transmitted to the variable impedance 38 through the filter circuit network 110 lowers, the signal amplifier 39, gain control amplifier 40, rectifying diodes D₃ and D₄ and voltage-current converter 41 (particularly, an output signal from the voltage-current converter 41) raise the impedance of the variable impedance 38 and increase the output signal of the signal amplifier 39 (the output signal of the low-level side chain 15) which is supplied to a combining network 16 through the overshoot suppressor 52.

When the switch S₅ falls into the "on" state, a predetermined control current flows from a constant current source $I_2$ into the variable impedance 38, with the result that the impedance of the variable impedance 38 lowers conspicuously. Then, the output signal of the signal amplifier 39 is no longer supplied to the combining network 16 through the overshoot suppressor 52, and the low-level side chain 15 stops its amplitude-frequency characteristic control operation.

As the variable impedance 33 of the high-level side chain 13 and the variable impedance 38 of the low-level side chain 15, variable impedances such as taught in the official gazette of Japanese Laid-Open Patent Specification No. 52-116052 entitled "Electronic Impedance Device" (corresponding to U.S. Pat. No. 4,220,875) can be used. It is also known to those in the art that the value Z of the input impedance of such known variable impedance is proportional to the value $I_{BIAS}$ of a bias current inside the variable impedance and is inversely proportional to a control current $I_{CONTROL}$ supplied from outside the variable impedance.

On the other hand, it has been revealed by the inventors' study that when the signal level which is transmitted to the variable impedance 33 of the high-level side chain 13 through the filter circuit network 100 under the condition of the "off" state of the switch S₄ is substantially null, the impedance value Z of the variable impedance 33 should be maintained very high and stable. Similarly, when the signal level which is transmitted to the variable impedance 38 of the low-level side chain 14 through the filter circuit network 10 under the condition of the "off" state of the switch S₅ is substantially null, the variable impedance value Z should be maintained very high and stable.

On the basis of the results of the inventors' study as described above, especially in an example according to the present invention, a bias circuit 42 is arranged in the high-level side chain 13, and a bias circuit 43 in the low-level side chain 15. As a result, in a case where the signal level which is transmitted to the variable impedance 33 of the high-level side chain 13 is substantially null and where the signal level which is transmitted to the variable impedance 38 of the low-level side chain 15 is substantially null, the voltage-current converters 36A and 36B biased by the bias circuit 42 supply the variable impedance 33 of the high-level side chain 13 with a stable minute control current, while the voltage-current converter 41 biased by the bias circuit 43 supplies the variable impedance 38 of the low-level side chain 15 with a stable minute control current.

Further, in an example according to the present invention, the voltage-current conversion coefficients of the two voltage-current converters 36A and 36B of the high-level side chain 13 are set to be approximately equal to each other. Besides this, when the control signal OFF/B/C is at the third level, an output of the change-over control circuit 21 which is coupled to the voltage-current converter 36B (connection not shown for drawing simplification) inhibits the voltage-current conversion operation of the voltage-current converter 36B. As a result of this, the output control current of the voltage-current converter 36B becomes a substantially negligible value.

Figure 7:
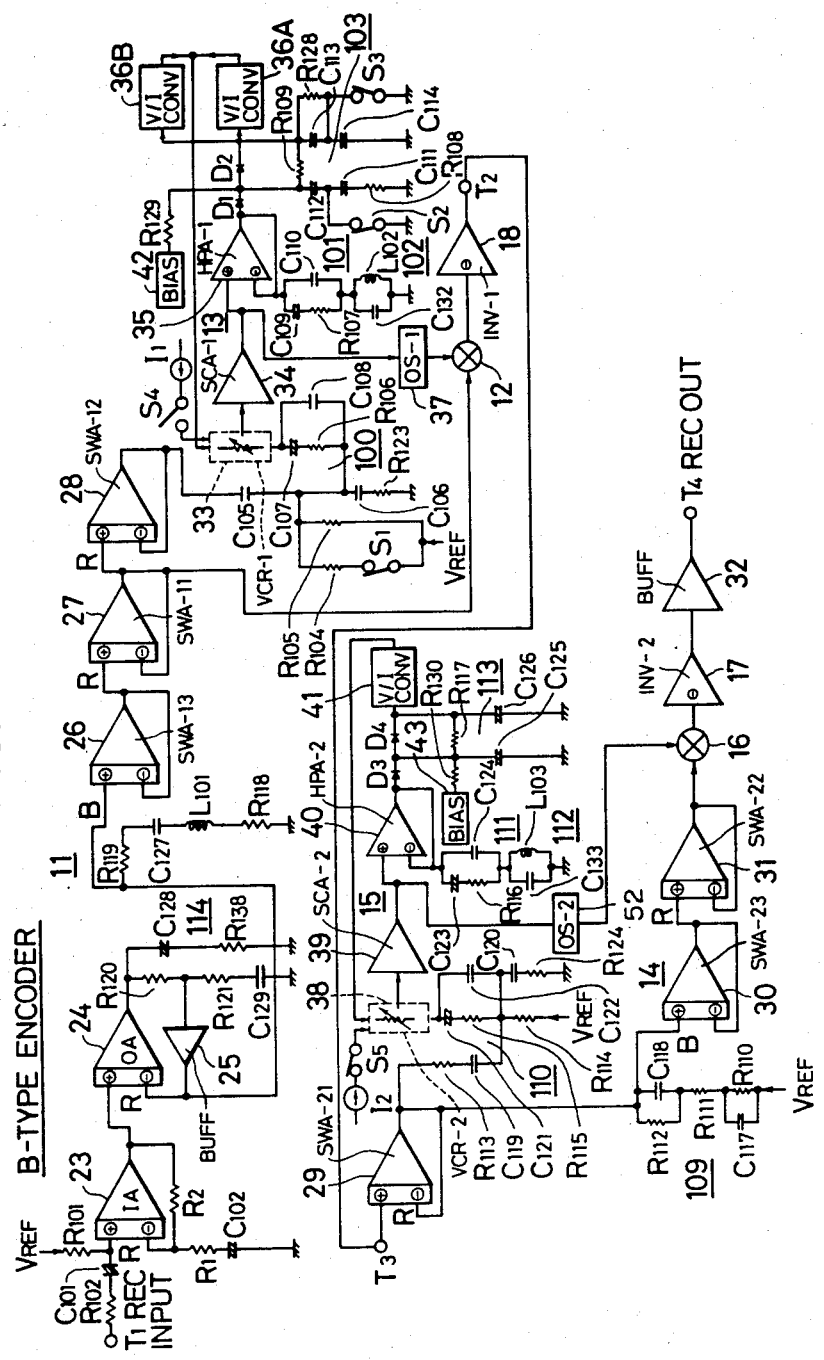
FIG. 7 is a circuit diagram showing signal transmission paths in the case where the noise reduction system of FIG. 6 operates as a Dolby B-type encoder.

FIG. 7 is a circuit diagram showing signal transmission paths in the case where the control signal OFF/B/C becomes the second level and the other control signal R/P becomes the first level, so that the noise reduction system of FIG. 6 operates as a Dolby B-type encoder. In this case, since the switch S₅ is in the "on" state, the low-level side chain 15 stops the amplitude-frequency characteristic control operation thereof as already explained. In the meantime, since the switch S₄ is in the "off" state, the high-level side chain 13 executes its amplitude-frequency characteristic control operation.

A bias voltage generated from the bias circuit 42 is divided by resistors $R_{129}$, $R_{109}$ and $R_{128}$, and the divided voltage at the common node of the resistors $R_{109}$ and $R_{128}$ is supplied to the input terminals of the two voltage-current converters 36A and 36B. The resistances of the resistors $R_{109}$ and $R_{128}$ are set so that the divided voltage of the common node of the resistors $R_{109}$ and $R_{128}$ may become a voltage of half of the voltage of the common node under the "off" state of the switch S₃ when one end of the resistor $R_{128}$ has been grounded through the switch S₃ under the "on" state in the case where the signal level transmitted to the variable impedance 33 of the high-level side chain 13 through the filter circuit network 100 under the condition of the "off" state of the switch S₄ is substantially null.

Accordingly, a minute control current $I_i/2$ of half of a minute control current $I_i$ in the case where the switch S₃ is in the "off" state flows through each of the outputs of the two voltage-current converters 36A and 36B. Therefore, the variable impedance 33 is controlled by the minute control currents totaling $I_i$, and it will have a very high no-signal impedance $Z_i$.

When an A.C. signal of high amplitude level is transmitted to the variable impedance 33 of the high-level side chain 13 through the filter circuit network 100 under the condition of the "off" state of the switch S₄, the rectifying diodes D₁ and D₂ fall into the "on" states. Therefore, the same rectified voltage as that in the case where the switch S₃ is in the "off" state is applied to the inputs of the two voltage-current converters 36A and 36B when the switch S₃ is in the "on" state. Accordingly, a control current $I_C$ proportional to the rectified voltage flows through each of the outputs of the two voltage-current converters 36A and 36B. Therefore, the variable impedance 33 is controlled by the control currents totaling $2 I_C$, and it becomes a comparatively low operating impedance.

An encoded output signal (recording audio output signal) which is derived from a terminal $T_4$ of the signal transmission paths shown in FIG. 7 is amplified by the recording amplifier 104 as shown in FIG. 6, and is thereafter applied to the recording head 108 through the bias trap circuit 105. The recording head 108 has an A.C. bias signal of 60 kHz–100 kHz similarly applied thereto from the bias oscillator 107. Owing to the frequency characteristic of the magnetic tape, however, only the audio signal is recorded on the magnetic tape, and the A.C. bias signal is not recorded.

Figure 8:
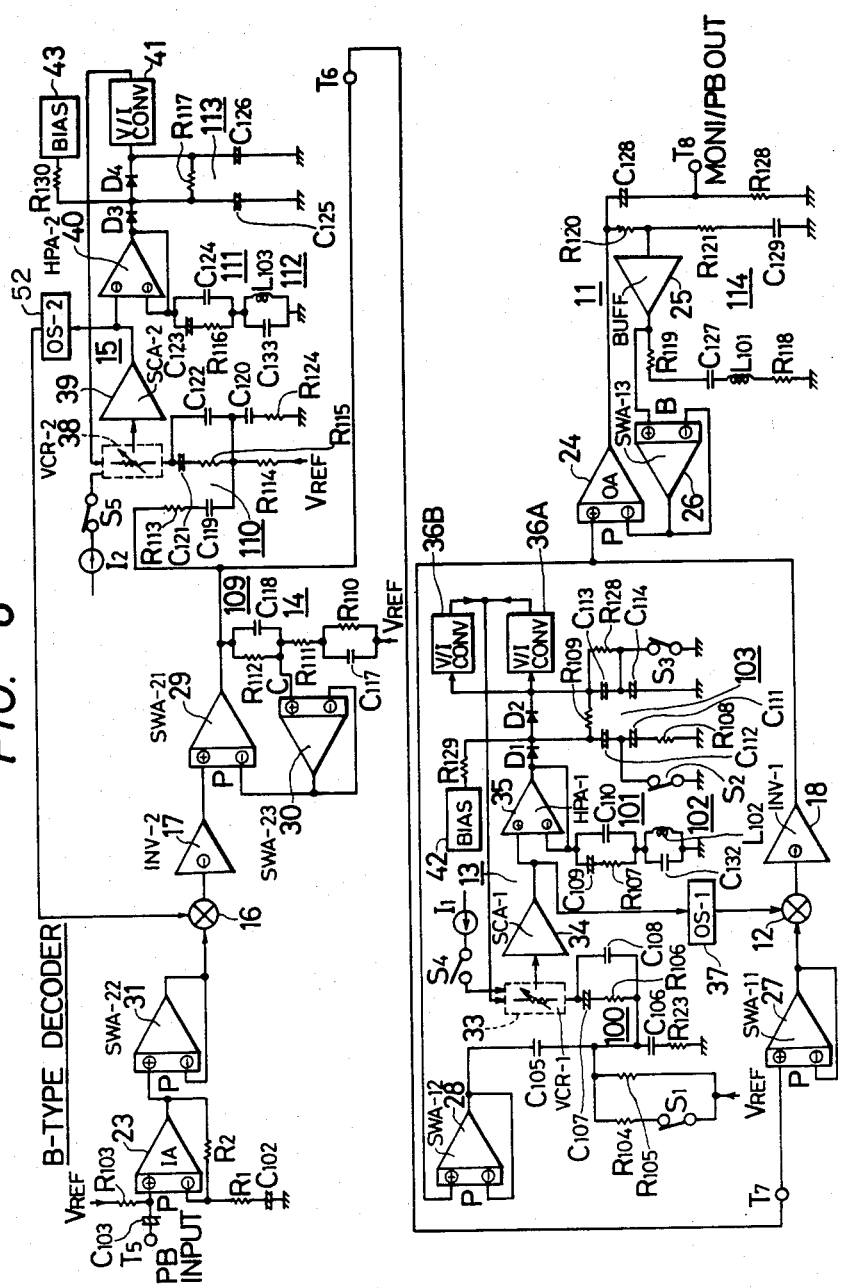
FIG. 8 is a circuit diagram sowing signal transmission paths in the case where the noise reduction of FIG. 6 operates as a Dolby B-type decoder.

FIG. 8 is a circuit diagram showing signal transmission paths in the case where the control signal OFF/B/C becomes the second level and the other control signal R/P becomes the second level, so that the noise reduction system of FIG. 6 operates as a Dolby B-type decoder. Similar to the situation discussed for FIG. 7, in FIG. 8, when the signal level transmitted to the variable impedance 33 of the high-level side chain 13 is substantially null, the variable impedance 33 is controlled by the minute control currents totaling $I_i$. Also, when an A.C. signal of high amplitude level is transmitted to the variable impedance 33 of the high-level side chain 13, the variable impedance 33 is controlled by the control currents totaling $2 I_c$.

Figure 9:
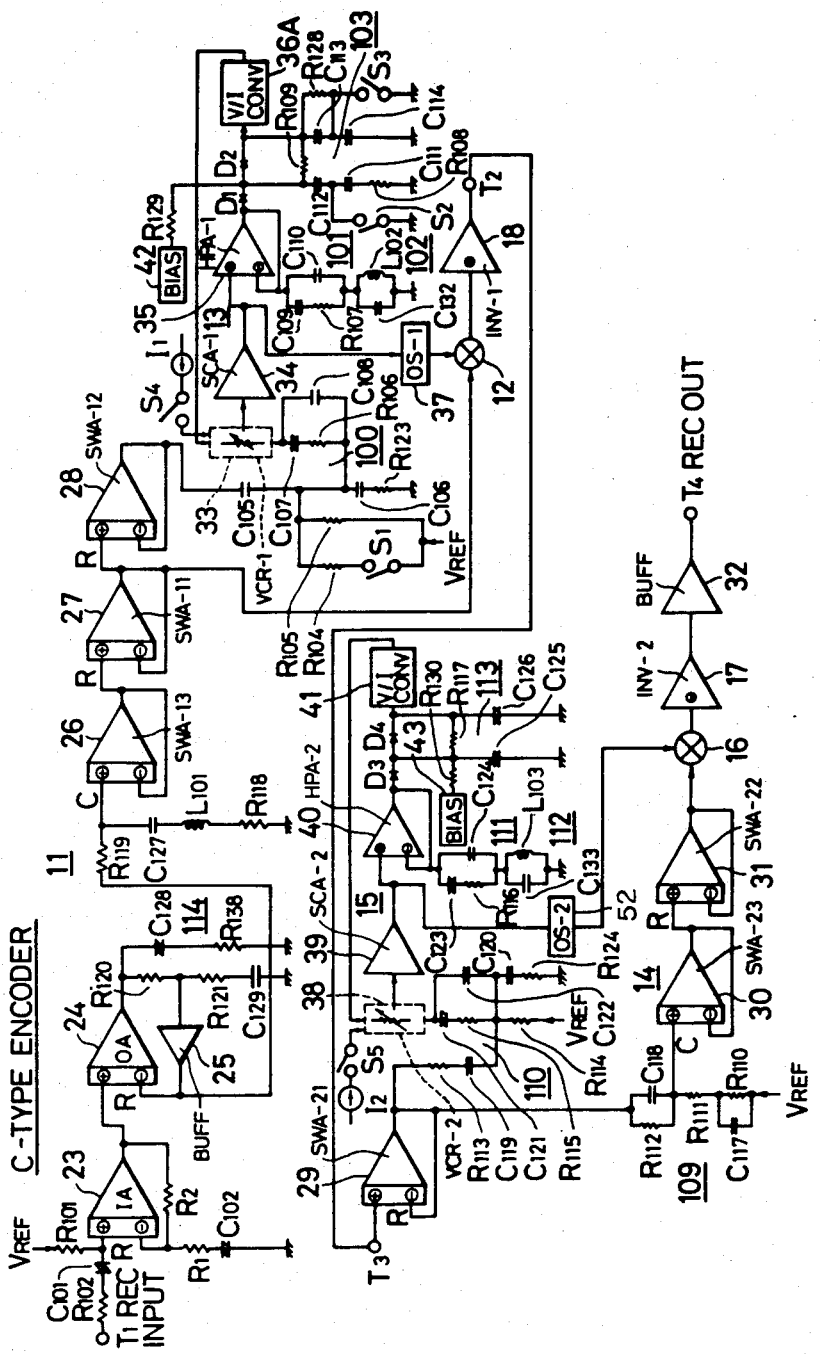
FIG. 9 is a circuit diagram showing signal transmission paths in the case where the noise reduction system of FIG. 6 operates as a Dolby C-type encoder.

FIG. 9 is a circuit diagram showing signal transmission paths in the case where the control signal OFF/B/C becomes the third level and the other control signal R/P becomes the first level, so that the noise reduction system of FIG. 6 operates as a C-type encoder.

When the control signal OFF/B/C becomes the third level, the change-over control circuit 21 substantially inhibits the operation of the voltage-current converter 36B of the high-level side chain 13, as already explained. On the other hand, the switch $S_3$ is controlled into the "off" state by the change-over control circuit 21, so that a minute control current of $I_i$ flows through only the output of the voltage-current converter 36A biased by the bias circuit 42. Accordingly, in the case where the signal level transmitted to the variable impedance 33 is substantially null, the variable impedance 33 is controlled by the minute control current amounting to $I_i$. On the other hand, in the case where an A.C. signal of high amplitude level is transmitted to the variable impedance 33, the variable impedance 33 is controlled by the control current amounting to $I_c$.

Figure 1:
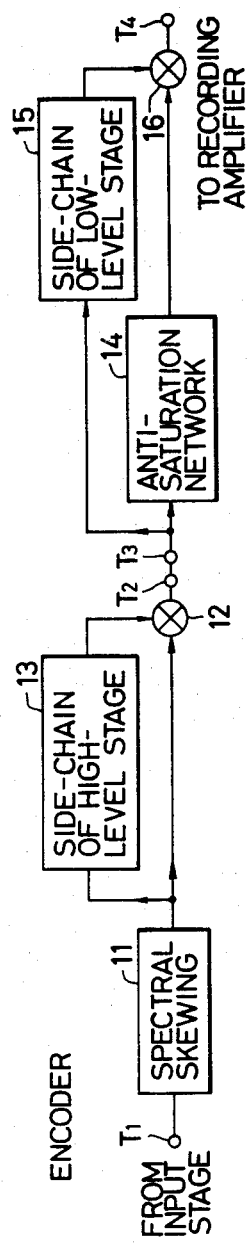
FIG. 1 shows circuit blocks for a well-known Dolby C-type noise reduction system connected to operate as a C-type encoder.

The signal transmission paths shown in FIG. 9 operate as a Dolby C-type encoder such as shown in FIG. 1. An encoded output signal (recording audio output signal) derived from a terminal $T_4$ in FIG. 9 is amplified by the recording amplifier 104 as shown in FIG. 6, and is thereafter applied to the recording head 108 through the bias trap 105. The recording head 108 has the A.C. bias signal of 60 kHz–100 kHz applied thereto from the bias oscillator 107. However, only the audio signal is recorded on the magnetic tape and substantially no A.C. bias signal is recorded owing to the frequency characteristic of the magnetic tape.

Figure 10:
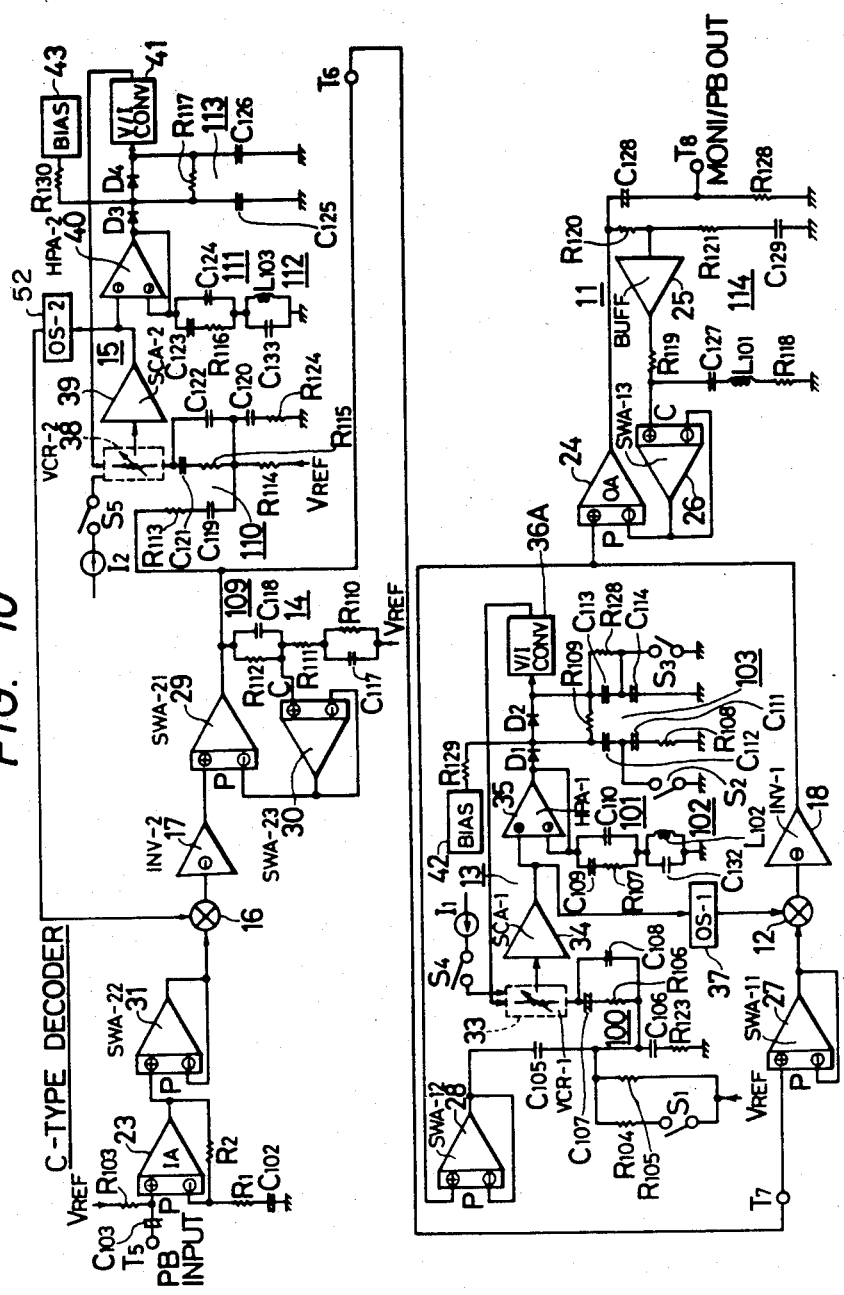
FIG. 10 is a circuit diagram showing signal transmission paths in the case where the noise reduction system of FIG. 6 operates as a Dolby C-type decoder.

FIG. 10 is a circuit diagram showing signal transmission paths in the case where the control signal OFF/B/C becomes the third level and the other control signal R/P becomes the second level, so that the noise reduction system of FIG. 6 operates as a C-type decoder. As was the case in FIG. 9, when the signal level transmitted to the variable impedance 33 is substantially null, the variable impedance 33 is controlled by the minute control current amounting to $I_i$. Also, when an A.C. signal of high amplitude level is transmitted to the variable impedance 33, this variable impedance 33 is controlled by the control current amounting to $I_c$.

Figure 2:
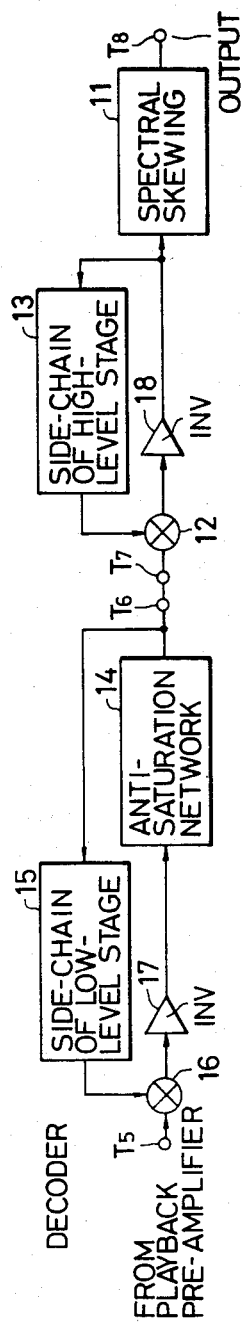
FIG. 2 shows circuit blocks for the well-known Dolby C-type noise reduction system connected to operate as a decoder.

The signal transmission paths shown in FIG. 10 operate as the Dolby C-type decoder such as shown in FIG. 2. The foregoing audio signal recorded on the magnetic tape by the recording head 108 is detected by a playback head (not shown), and is supplied to a terminal $T_5$ as a playback input signal PB INPUT through a playback equalizer (not shown).

It will be described in detail below that when the noise reduction system based on the embodiment of the present invention shown in FIG. 6 operates as a B-type system, errors from the encode quantity and decode quantity of the known B-type system are small.

Figure 11:
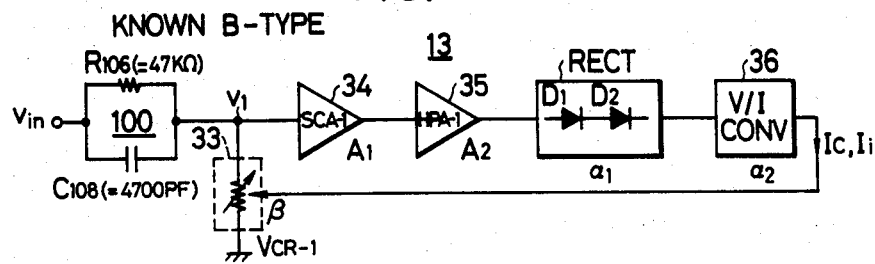
FIG. 11 is a circuit diagram showing the side chain of a known Dolby B-type system.

I. Known B-type system:

FIG. 11 shows the side chain 13 of the known B-type system. A filter circuit network 100 is constructed of a resistor $R_{106}$ of 47 k$\Omega$ and a capacitor $C_{108}$ of 4700 pF, and the impedance of a variable impedance 33 is controlled by a signal amplifier 34, a gain control amplifier 35, a rectifier-integrator RECT and a voltage-current converter 36.

A. Large amplitude response: Letting $v_{in}$ denote a signal voltage to the filter circuit network 100, $v_1$ denote the signal voltage of the variable impedance 33, $A_1$ denote the gain of the signal amplifier 34, $A_2$ denote the gain of the gain control amplifier 35, $\alpha_1$ denote the conversion coefficient of the rectifier-integrator RECT, $\alpha_2$ denote the conversion coefficient of the voltage-current converter 36 and $\beta$ denote the conversion coefficient of the variable impedance 33, then the control current $I_c$ of the voltage-current converter 36 and the impedance $Z_{in}$ of the variable impedance 33 can be respectively evaluated as follows:

$$I_c = \alpha_2 \cdot \alpha_1 \cdot A_2 \cdot A_1 \cdot v_1 \tag{1}$$

$$Z_{in} = \frac{\beta}{I_c} = \frac{\beta}{\alpha_2 \cdot \alpha_1 \cdot A_2 \cdot A_1 \cdot v_1} = \frac{K}{v_1} \tag{2}$$

A-1. Low-frequency large-amplitude response: The signal voltage $v_l$ of the variable impedance 33 in the case where the signal voltage $v_{in}$ of low frequency and large amplitude has been applied to the filter circuit network 100 can be evaluated as follows:

$$v_1 = \frac{Z_{in}}{R_{106} + Z_{in}} \cdot v_{in} = \frac{\frac{K}{v_1}}{R_{106} + \frac{K}{v_1}} \cdot v_{in} \tag{3}$$

$$\therefore v_1 = \frac{-\frac{K}{R_{106}} \pm \sqrt{\frac{K^2}{R_{106}^2} + \frac{4K}{R_{106}} \cdot v_{in}}}{2}$$

A-2. High-frequency large-amplitude response: The signal voltage $v_l$ of the variable impedance 33 in the case where the signal voltage $v_{in}$ of high frequency and large amplitude has been applied to the filter circuit network 100 can be evaluated as follows:

$$v_1 = \frac{Z_{in}}{\frac{1}{j\omega C_{108}} + Z_{in}} \cdot v_{in} = \frac{\frac{K}{v_1}}{\frac{1}{j\omega C_{108}} + \frac{K}{v_1}} \tag{4}$$

$$\therefore v_1 = \frac{-Kj\omega C_{108} \pm \sqrt{-K^2\omega^2 C_{108}^2 + 4Kj\omega C_{108} \cdot v_{in}}}{2}$$

B. Minute-amplitude response: When a signal voltage $v_{in}$ of minute amplitude has been applied to the filter circuit network 100, a very high no-signal initial impedance $Z_i$ of the variable impedance 33 which is determined as below by the minute control current $I_i$ of the voltage-current converter 36 in the presence of no signal determines the transmission characteristic of the side chain 13.

$$Z_i = \frac{\beta}{I_i} \tag{5}$$

B-1. Low-frequency minute-amplitude response: The signal voltage $v_1$ of the variable impedance 33 in the case where the signal voltage $v_{in}$ of low frequency and minute amplitude has been applied to the filter circuit network 100 can be evaluated as follows:

$$v_1 = \frac{Z_i}{R_{106} + Z_i} \cdot v_{in} \tag{6}$$

B-2. High-frequency minute-amplitude response: The signal voltage $v_1$ of the variable impedance 33 in the case where the signal voltage $v_{in}$ of high frequency and minute amplitude has been applied to the filter circuit network 100 can be evaluated as follows:

$$v_1 = \frac{Z_i}{\frac{1}{j\omega C_{108}} + Z_i} \cdot v_{in} \approx v_{in} \tag{7}$$

$$\left( \because \frac{1}{j\omega C_{108}} << Z_i \right)$$

Figure 12:
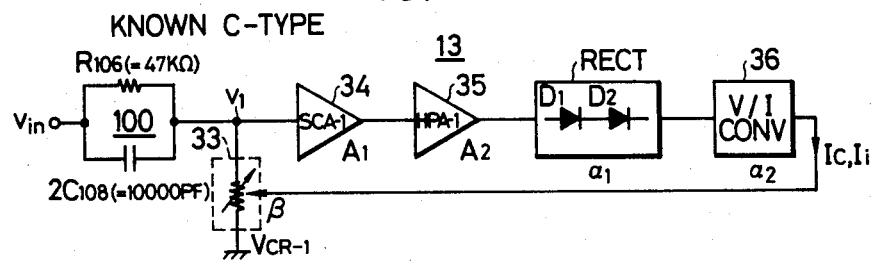
FIG. 12 is a circuit diagram showing the high-level side chain of a known Dolby C-type system.

II. Known C-type system:

FIG. 12 shows the high-level side chain 13 of the known C-type system. A filter circuit network 100 is constructed of a resistor $R_{106}$ of 47 k$\Omega$ and a capacitor $2C_{108}$ of 10,000 pF, and signal responses under various conditions become as follows:

A-1. Low-frequency large-amplitude response:

$$v_1 = \frac{Z_{in}}{R_{106} + Z_{in}} \cdot v_{in} = \frac{\frac{K}{v_1}}{R_{106} + \frac{K}{v_1}} \cdot v_{in} \tag{8}$$

$$\therefore v_1 = \frac{-\frac{K}{R_{106}} \pm \sqrt{\frac{K^2}{R_{106}^2} + \frac{4K}{R_{106}} \cdot v_{in}}}{2}$$

A-2. High-frequency large-amplitude response:

$$v_1 = \frac{Z_{in}}{\frac{1}{j\omega 2 C_{108}} + Z_{in}} \cdot v_{in} = \frac{\frac{K}{v_1}}{\frac{1}{j\omega 2 C_{108}} + \frac{K}{v_1}} \cdot v_{in} \tag{9}$$

$$\therefore v_1 = \frac{-Kj\omega 2 C_{108} \pm \sqrt{-K^2 \omega^2 4 C_{108}^2 + 8Kj\omega C_{108} \cdot v_{in}}}{2}$$

B-1. Low-frequency minute-amplitude response:

$$v_1 = \frac{Z_i}{R_{106} + Z_i} \cdot v_{in} \tag{10}$$

B-2. High-frequency minute-amplitude response:

$$v_1 = \frac{Z_i}{\frac{1}{j\omega 2 C_{108}} + Z_i} \cdot v_{in} \approx v_{in} \tag{11}$$

$$\left( \because \frac{1}{j\omega 2 C_{108}} << Z_i \right)$$

Figure 13:
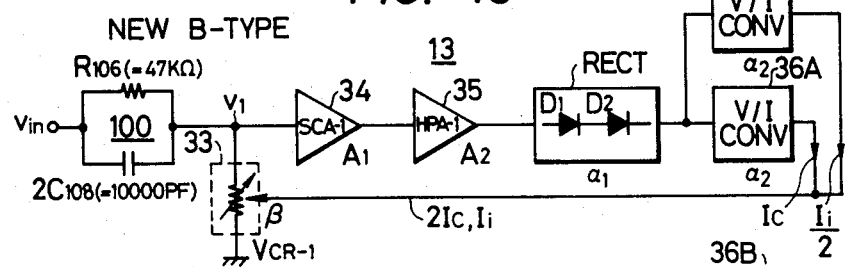
FIG. 13 is a circuit diagram showing a high-level side chain (13) in the case where the embodiment of the present invention shown in FIG. 6 operates as the B-type system.

III. B-type system of the present invention:

FIG. 13 shows the high-level side chain 13 in the case where the noise reduction system based on the embodiment of the present invention shown in FIG. 6 operates as the B-type system. A filter circuit network 100 is constructed of a resistor $R_{106}$ of 47 k$\Omega$ and a capacitor $2C_{108}$ of 10,000 pF, and two voltage-current converters 36A and 36B are provided.

A. Large-amplitude response:

Since the two voltage-current converters 36A and 36B pass control currents $I_c$ equal to each other as set forth below, the impedance $Z_{in}$ of the variable impedance 33 can be evaluated as follows:

$$I_c = a_2 \cdot a_1 \cdot A_2 \cdot A_1 \cdot v_1 \tag{12}$$

$$Z_{in} = \frac{\beta}{2I_c} = \frac{\beta}{2 \cdot a_2 \cdot a_1 \cdot A_2 \cdot A_1 \cdot v_1} = \frac{K}{2v_1} \tag{13}$$

A-1. Low-frequency large-amplitude response:

$$v_1 = \frac{Z_{in}}{R_{106} + Z_{in}} \cdot v_{in} = \frac{\frac{K}{2v_1}}{R_{106} + \frac{K}{2v_1}} \cdot v_{in} \tag{14}$$

$$\therefore v_1 = \frac{-\frac{K}{2R_{106}} \pm \sqrt{\frac{K^2}{4R_{106}^2} + \frac{2K}{R_{106}} \cdot v_{in}}}{2}$$

As apparent from the comparison between Expression (14) and Expression (3), in the case where the noise reduction system of the present invention operates as the B-type system, either an encode error or decode error develops in the low-frequency large-amplitude response. According to an actual measurement, however, the error has been verified to be in a degree allowable in practical use.

On the other hand, as another embodiment of the present invention, the resistor $R_{106}$ of the filter circuit network 100 can be altered from 47 k$\Omega$ to 24 k$\Omega$ (i.e. approximately $\frac{1}{2}$ of the original value). Then, Expression (14) and Expression (3) become perfectly equal, and the encode error or decode error in the low-frequency large-amplitude response in the case where the system of the embodiment operates as a B-type system does not develop.

However, when the value of the resistor $R_{106}$ is altered to about half in this manner, some encode error or decode error develops in the low-frequency large-amplitude response in the case where the system of the embodiment operates as the C-type system.

In the noise reduction system of the present embodiment, accordingly, the resistor $R_{106}$ is set at 47 kΩ in order to prefer the signal response in the case of the operation as the C-type system. A-2. High-frequency large-amplitude response:

$$v_1 = \frac{Z_{in}}{\frac{1}{j\omega 2C_{108}} + Z_{in}} \cdot v_{in} = \frac{\frac{K}{2v_1}}{\frac{1}{j\omega 2C_{108}} + \frac{K}{2v_1}} \cdot v_{in} \quad (15)$$

$$v_1 = \frac{-\frac{K}{2} \cdot j2C_{108} \pm \sqrt{\frac{K^2\omega^2 4 C_{108}^2}{4} + 2K \cdot j\omega 2C_{108} \cdot v_{in}}}{2}$$

$$= \frac{-Kj\omega C_{108} \pm \sqrt{-K^2\omega^2 C_{108}^2 + 4Kj\omega C_{108} \cdot v_{in}}}{2}$$

In this manner, Expression (15) becomes perfectly equal to Expression (4), and when the noise reduction system of the present invention operates as the B-type system, neither an encode error nor a decode error develops in the high-frequency large-amplitude response.

B. Minute-amplitude response:

Since the two voltage-current converters 36A and 36B pass equal minute control currents $I_i/2$ during periods of no signal, the no-signal initial impedance $Z_i$ of the variable impedance 33 is evaluated as follows:

$$Z_i = \frac{\beta}{2 \cdot \frac{I_i}{2}} = \frac{\beta}{I_i} \quad (16)$$

B-1. Low-frequency minute-amplitude response:

$$v_1 = \frac{Z_i}{R_{106} + Z_i} \cdot v_{in} \quad (17)$$

B-2. High-frequency minute-amplitude response:

$$v_1 = \frac{Z_i}{\frac{1}{j\omega 2C_{108}} + Z_i} \cdot v_{in} \approx v_{in} \quad (18)$$

$$\left( \because \frac{1}{j\omega 2C_{108}} << Z_i \right)$$

In this manner, Expression (17) and Expression (6) become equal, and Expression (18) and Expression (7) become equal. Therefore, in the case where the noise reduction system of the present invention operates as a B-type system, neither an encode error nor a decode error develops in the low-frequency and high-frequency minute-amplitude responses.

Figure 14:
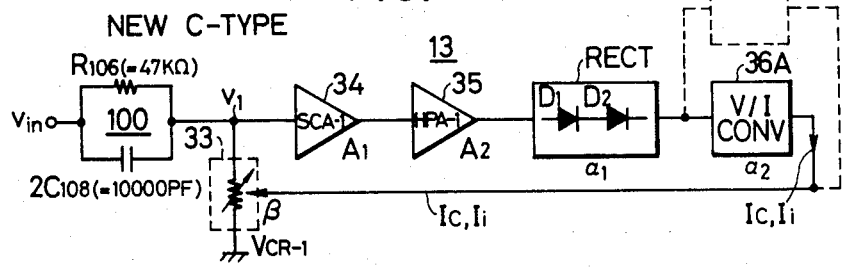
FIG. 14 is a circuit diagram showing a high-level side chain (13) in the case where the embodiment of the present invention shown in FIG. 6 operates as the C-type system.

IV. C-type system of the present invention:

FIG. 14 shows the high-level side chain 13 in the case where the noise reduction system based on the embodiment of the present invention shown in FIG. 6 operates as the C-type system. A filter circuit network 100 is constructed of a resistor $R_{106}$ of 47 kΩ and a capacitor $2C_{108}$ of 10,000 pF, and the operation of the voltage-current converter 36B is substantially inhibited. The voltage-current converter 36A passes the minute control current $I_i$ in the minute-amplitude response, and it passes the control current $I_c$ in the large-amplitude response. Accordingly, the operations of the high-level side chain 13 in FIG. 14 become perfectly equal to those of the side chain 13 of the known C-type system illustrated in FIG. 12. Thus, when the noise reduction system of the present invention operates as the C-type system, no encode error or no decode error develops either in the low-frequency and high-frequency large-amplitude responses or in the low-frequency and high-frequency minute-amplitude responses.

Although the above discussion is specifically directed to how the arrangement of the shared filter elements and the voltage-current converters with the bias circuit of the present invention serves to prevent encode and decode errors, it should be noted that another source for such errors exists. Specifically, it is common practice that an audio signal is recorded onto a magnetic tape by superposing an A.C. bias signal of 60 kHz–100 kHz thereon. In this regard, the side chain of the known Dolby noise reduction system of the B-type or the C-type not only responds to audio signal components of high frequencies, but also responds sensitively to the A.C. bias signal of 60 kHz–100 kHz. Therefore, the known noise reduction system involves comparatively large encode and decode errors for this reason.

The signal transmission circuit shown in FIG. 8 operates as the Dolby B-type decoder. The foregoing audio signal recorded on the magnetic tape by the recording head 108 is detected by the playback head (not shown), and is supplied to the terminal $T_5$ as the playback input signal PB INPUT through the playback equalizer (not shown).

In the case where the noise reduction system of FIG. 6 operates as the decoder of the B-type or the C-type, the bias oscillator 107 stops its oscillation operation, with the result that the A.C. bias signal is not oscillated from the bias oscillator 107. In the case where the noise reduction system of FIG. 6 operates as the encoder of the B-type or the C-type, the bias oscillator 107 generates the A.C. bias signal of comparatively great voltage amplitude (100 $V_{p-p}$).

On the other hand, in the case where the noise reduction system operates as the B-type encoder, the variable impedance 33 of the high-level side chain 13 must be controlled to a high impedance by the lowering of the signal level of the recording input signal REC INPUT. In the case where the noise reduction system operates as the C-type encoder, both the variable impedance 33 of the high-level side chain 13 and the variable impedance 38 of the low-level side chain 15 must be controlled to high impedances by the lowering of the signal level of the recording input signal REC INPUT.

In the case where the noise reduction system operates as the B-type or C-type encoder, the bias oscillator 107 generates an A.C. bias signal of large voltage amplitude. As a result, A.C. bias signal components of unnegligible levels are induced in various parts of the noise reduction system by the capacitive couplings or inductive couplings between the output of the bias circuit 107 and the parts of the noise reduction system.

With regard to these induced A.C. bias signal components, an important aspect of the present invention is the inclusion of the bias trap circuits 102 and 112. If the bias trap circuits 102 and 112 are omitted from the noise reduction system of FIG. 6, unnegligible A.C. bias signal currents will flow through the frequency characteristic determining circuits 101 and 111 of the high-level side chain 13 and the low-level side chain 15, respectively, even when the audio signal level of the recording input signal REC INPUT is low. Since such unnegligible A.C. bias signal currents flow through the frequency characteristic determining circuits 101 and 111, the output signals of the gain control amplifiers 35 and 40 increase undesirably. Accordingly, in spite of the small recording input signal REC INPUT, both the variable impedance 33 of the high-level side chain 13 and the variable impedance 38 of the low-level side chain 15 are undesirably controlled to low impedances by the induced A.C. bias signals.

As a result, in the case of omitting the bias trap circuits 102 and 112, although the noise reduction system operates as the B-type or C-type encoder, the actual encode characteristic of the system departs far from the ideal encode characteristic of each.

In contrast, in the noise reduction system according to the present invention, the bias trap circuits 102 and 112 are specifically arranged as illustrated in FIG. 6. Since the parallel resonance frequencies of the bias trap circuits 102 and 112 are set to be substantially equal to the frequency of the A.C. bias signal which is oscillated from the bias oscillator 107, the impedances of the bias trap circuits 102 and 112 become very large values at the frequency of the A.C. bias signal. Thus, the A.C. bias signal currents are prevented from flowing from the outputs of the gain control amplifiers 35 and 40 via the frequency characteristic determining circuits 101 and 111 to the bias trap circuits 102 and 112, respectively. Accordingly, if the recording input signal REC INPUT is small, the output signals of the gain control amplifiers 35 and 40 become low levels in proportion to the level of the recording input signal REC INPUT. Even when the noise reduction system of FIG. 6 operates as a B-type encoder or a C-type encoder, the encode characteristic thereof does not depart far from the ideal encode characteristic of each.

In the case where the noise reduction system operates as a B-type or C-type decoder, the oscillation of the A.C. bias signal from the bias oscillator 107 is stopped. In this case, accordingly, the bias trap circuits 102 and 112 can be operationally omitted in such a way that switches which are respectively connected in parallel with the bias trap circuits 102 and 112 are controlled into their "on" states.

The present invention utilizing bias trap circuits is also applicable to a noise reduction system which is exclusively used for Dolby B-type or Dolby C-type systems.

The present invention is not restricted to the foregoing embodiment, and it can adopt various modified aspects of performance on the basis of the fundamental technical idea thereof.

By way of example, the bias circuit 41 of the high-level side chain 13 and the bias circuit 43 of the low-level side chain 15 need not be arranged independently, but a single bias circuit can be used for both the side chains 13 and 15. Also, the switching amplifiers 23, 24, 26, 27, 28, 29 and 30 can also be constructed of any suitable switching means including analog switches constructed of MOSFETs or the like.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A noise reduction system comprising:
    a first level processing circuit which has a first combining network, and a first signal inverter, an anti-saturation network and a low-level side chain coupled to said first combining network;
    a second level processing circuit which has a second combining network, and a second signal inverter, a spectral skewing network and a high-level side chain coupled to said second combining network;
    said low-level side chain including a first filter circuit network, a first variable impedance and a first voltage-current converter;
    said high-level side chain including a second filter circuit network, a second variable impedance and a second voltage-current converter and a third voltage-current converter whose characteristics are substantially equal to each other, and
    a control circuit coupled to said third voltage-current converter, said control circuit including means for selectively permitting or inhibiting an operation of said third voltage-current converter.

2. A noise reduction system which can be operated either as a Dolby B-type or Dolby C-type system comprising:
    a first level processing circuit which has a first combining network, a first signal inverter, an anti-saturation network and a low-level side chain;
    a second level processing circuit which has a second combining network, a second signal inverter, a spectral skewing network and a high-level side chain;
    said low-level side chain including a first filter circuit network, a first variable impedance and a first voltage-current converter;
    said high-level side chain including a second filter circuit network, a second variable impedance and a second voltage-current converter and a third voltage-current converter whose characteristics are substantially equal to each other;
    means for inhibiting an operation of said third voltage-current converter to operate the noise reduction system as a Dolby C-type system; and
    means for reducing an impedance of said first variable impedance and for simultaneously operating said second voltage-current converter and said third voltage-current converter to operate the noise reduction system as a Dolby B-type system.

3. A noise reduction system according to claim 2, wherein said noise reduction system includes means for setting a bias current flow through each of the second and third voltage-current converters during Dolby B-type operation when no input signal is received by said noise reduction system at a value of about half of a bias current which flows through said second voltage-current converter when said noise reduction system operates as the Dolby C-Type system when no input signal is received by said noise reduction system.

4. A noise reduction system according to claim 2 or 3, including means for maintaining the same filter parameters for said second filter network regardless of whether said noise reduction system operates as a type B or type C Dolby system.

5. A noise reduction system according to claim 4, wherein said second filter network includes a fixed value resistor and a fixed value capacitor coupled in parallel with one another between an input terminal for said noise reduction system and said second and third voltage-converters.

6. A noise reduction system according to claim 5, wherein said fixed value resistor has a value of b 47 kΩ and said fixed value capacitor has a value of 10,000 pF.

7. A noise reduction system according to claims 1, 2 or 3, wherein said low level side chain further includes a first signal amplifier, a first gain control amplifier, first rectifying diodes and a first overshoot suppressor, and wherein said high-level side chain further includes a second signal amplifier, a second gain control amplifier, second rectifying diodes and a second overshoot suppressor.

8. A noise reduction system according to claim 4, wherein said low level side chain further includes a first signal amplifier, a first gain control amplifier, first rectifying diodes and a first overshoot suppressor, and wherein said high-level side chain further includes a second signal amplifier, a second gain control amplifier, second rectifying diodes and a second overshoot suppressor.

9. A noise reduction system according to claim 5, wherein said low level side chain further includes a first signal amplifier, a first gain control amplifier, first rectifying diodes and a first overshoot suppressor, and wherein said high-level side chain further includes a second signal amplifier, a second gain control amplifier, second rectifying diodes and a second overshoot suppressor.

10. A noise reduction system according to claim 6, wherein said low level side chain further includes a first signal amplifier, a first gain control amplifier, first rectifying diodes and a first overshoot suppressor, and wherein said high-level side chain further includes a second signal amplifier, a second gain control amplifier, second rectifying diodes and a second overshoot suppressor.

* * * * *